United States Patent [19]
Goujard et al.

[11] Patent Number: 5,246,736
[45] Date of Patent: Sep. 21, 1993

[54] PROCESS FOR THE MANUFACTURE OF A REFRACTORY COMPOSITE MATERIAL PROTECTED AGAINST CORROSION

[75] Inventors: Stephane R. Goujard, Merignac; Lionel Vandenbulcke, Saint Jean le Blanc; Jacques Rey, Merignac; Jean-Luc Charvet, Saint Medard en Jalles; Henri Tawil, Le Bouscat, all of France

[73] Assignee: Societe Europeenne de Propulsion, Suresnes, France

[21] Appl. No.: 782,388

[22] Filed: Oct. 25, 1991

[30] Foreign Application Priority Data

Oct. 26, 1990 [FR] France ................... 90 13323

[51] Int. Cl.$^5$ ............................. C23C 16/32
[52] U.S. Cl. ................... 427/249; 427/255.2; 427/255.7; 427/419.7
[58] Field of Search ............ 427/249, 255.2, 255.7, 427/419.7, 255; 428/408, 698, 699, 704

[56] References Cited

U.S. PATENT DOCUMENTS

| 4,465,777 | 8/1984 | Shuford | 427/419.7 |
| 4,613,522 | 9/1986 | Vasilos | 427/249 |
| 4,668,579 | 5/1987 | Strangman et al. | 428/367 |
| 4,795,677 | 1/1989 | Gray | 428/408 |
| 4,868,056 | 9/1989 | Haselkorn | 428/408 |
| 4,889,686 | 12/1989 | Singh et al. | 419/13 |
| 4,894,286 | 1/1990 | Gray | 428/408 |
| 4,944,904 | 7/1990 | Singh et al. | 269/60 |
| 4,976,899 | 12/1990 | Rousseau et al. | 427/255.2 |
| 5,093,156 | 3/1992 | Uemura et al. | 427/255.7 |
| 5,094,901 | 3/1992 | Gray | 428/408 |

FOREIGN PATENT DOCUMENTS 0121797 10/1984 European Pat. Off. .
0176055 4/1986 European Pat. Off. .

OTHER PUBLICATIONS

"Performance Evaluations of Oxidation-Resistant Carbon-Carbon Composites in Simulated Hypersonic Vehicle Environments", D. M. Barrett et al., pp. 282-297 (1989).

Primary Examiner—Terry J. Owens
Attorney, Agent, or Firm—Weingarten, Schurgin, Gagnebin & Hayes

[57] ABSTRACT

The manufacture of a refractory composite material protected against corrosion and comprising fibrous reinforcement densified by a matrix, comprises a step of forming, either within the matrix or at its surface, at least one continuous layer constituted by a ternary silicon-boron-carbon system obtained by chemical vapor deposition or infiltration. The elements silicon and boron are thereby distributed uniformly, with the boron content in the Si-B-C system being not less than 5% in atom percentage.

10 Claims, 10 Drawing Sheets

1

PROCESS FOR THE MANUFACTURE OF A REFRACTORY COMPOSITE MATERIAL PROTECTED AGAINST CORROSION

BACKGROUND OF THE INVENTION

1. Field of the Invention

The present invention relates to the protection of refractory composite materials against corrosion, and more particularly against the action of oxygen or possibly water at high temperature.

The composite materials to which the invention applies are materials comprising refractory fibrous reinforcement densified by a matrix that is likewise refractory.

2. Prior Art

The material constituting the fibers of the fibrous reinforcement is generally carbon, or a ceramic such as silicon carbide, for example. The refractory matrix is constituted by carbon, or at least in part by a ceramic such as silicon carbide or a refractory oxide, for example. An interphase, in particular boron nitride or pyrolytic carbon, may be formed on the reinforcing fibers to ensure adequate bonding between the fibrous reinforcement and the matrix.

The fibrous reinforcement is densified with the matrix using a liquid technique or a gaseous technique, the densification serving to fill in, at least partially, the accessible pores of the fibrous reinforcement, throughout the volume of the latter.

With a liquid technique, the fibrous reinforcement is impregnated by a matrix precursor, e.g. a resin. After impregnation, heat treatment is applied during which the material constituting the matrix is obtained by a transformation of the precursor. Several successive impregnation and heat treatment cycles may be performed.

With the gaseous technique, the fibrous reinforcement is placed in an enclosure into which is admitted a gas that decomposes or reacts under particular temperature and pressure conditions to form a deposit on the reinforcing fibers, and throughout the volume thereof. Methods of chemical vapor infiltration of refractory materials are well known, notably in the case of ceramic materials, the infiltration optionally being conducted after forming a fiber-matrix bonding interphase. Reference may be made to the following documents: FR-A-2 401 888, EP-A-0 085 601, and EP-A-0 172 082.

Refractory composite materials are remarkable because of their thermostructural properties, i.e. mechanical properties which make them suitable for constituting structural components, and because of their ability to conserve these mechanical properties up to high temperatures. These materials are thus used in aeronautical and space applications, in particular.

However, if refractory composite materials are placed in an aggressive atmosphere during use, they are prone to damage by corrosion attacking the fibers of the reinforcement, the fiber-matrix interphase, or the matrix.

One type of corrosion that produces particularly severe problems in practice is the action of oxygen or the combined action of oxygen and water that occurs when the fibrous reinforcement or the matrix of such materials contain oxidizable substances (such as carbon, boron nitride, ...) and that are raised to high temperature in the presence of air, combustion gases, humidity, rain, .... This happens, for example, to the materials constituting the combustion chamber of a turbojet, or to the outside portions of space vehicles on re-entry to the atmosphere.

The action of corrosive agents is enhanced by the practically inevitable cracking of refractory composite materials. When such materials are used, cracks (generally microcracks) appear because of mechanical stresses applied to the materials or because of a difference in thermal expansion coefficients between the fibrous reinforcement and the matrix.

As shown very schematically in accompanying FIG. 1, each crack allows corrosive agents to access not only the material of the matrix M, but also fibers F, which may optionally be sheathed by an interphase I. Because of the almost inevitable residual porosity of the material (densification of the fibrous reinforcement is rarely complete), this phenomenon occurs not only at the surface, but also in the core of the material, with the corrosive agents being conveyed into the pores.

For high temperature applications in contact with air, and possibly in the presence of humidity, it is necessary to protect the refractory composite materials.

The state of the art concerning the protection of refractory composite materials, and in particular the protection of composite materials containing carbon against oxidation, is most abundant. The techniques used often rely on forming a protection that has healing properties for the purpose of plugging, filling, or sealing cracks that appear in the material. While the material is in use, variations in thermal and mechanical stresses give rise to variations in the shapes of the cracks, and in particular to a widening or a narrowing of the gaps between their lips. It is therefore necessary for the healing protective material to be capable of following such movements without itself cracking. For this reason, the protective material is usually a substance that forms a glass or that is capable of forming a glass, e.g. after being oxidized, the glass having viscous behavior at the temperature at which the material is used.

As shown in FIGS. 2 and 3, the glass V provides a protective function by forming a barrier preventing access of the corrosive agents into the cracks in the material. In FIG. 2, the glass V is made of substances deposited on the composite material. In FIG. 3, the glass V is formed by a corrosion (oxidation) of substances contained within the matrix material.

Refractory composite materials can be protected against oxidation by depositing a layer made of a silicon compound and/or by depositing a layer made of a boron compound, thereby forming a glass based on boron oxide ($B_2O_3$) or based on silica ($SiO_2$) or on a combination of both. For an illustration of this state of the art, reference may be made to the following documents: U.S. Pat. No. 4,668,579 and EP-0 176 055.

In Document U.S. Pat. No. 4,668,579 (inventors Strangman, et al.), a carbon-carbon (C/C) composite material is protected against oxidation by forming at least one protective layer comprising an inner boron carbide portion and an outer silicon carbide portion. The protective layer is preferably formed before complete densification of the composite material, typically after a step for consolidating the fibrous reinforcement, i.e. after partial densification has been performed to an extent which is just sufficient for bonding the reinforcing fibers together. The thickness of each portion of the protective layer lies in the range 0.5 microns to 5 microns (0.2 to 2 mils).

In Document EP-A-0 176 055 (inventors Holzl, et al.), a carbon body (which may be a C/C composite) is protected against oxidation by an initial chemical etching of the carbon body with a boron oxide to form interstices which extend down to a determined depth and which occupy about one-half of the initial volume of the carbon body down to that depth. The porosity created in this way is filled by inserting silicon or a silicon alloy, which, by reaction, gives rise to a layer made of substantially equal parts of silicon boride and silicon carbide. An additional surface coating, e.g. of silicon carbide, is formed with or without an intermediate layer of boron or of a boron compound. The carbon body treated in this way provides very good resistance to oxidation in air at a temperature of about 1370° C.

Patent documents U.S. Pat. Nos. 4,889,686 and 4,944,904 also concern the manufacture of a composite material protected from the oxidation by the introduction of a molten silicon compound within a porous preform. The preform is made from fibers having a boron nitride coating to prevent direct contact with the molten silicon, and in some cases an additional pyrolytic carbon coating to enhance the wetting by the silicon. The thus-coated fibers are then impregnated by an infiltration promoter in the form of short carbon fibers, or silicon carbide whiskers, and/or carbon powder mixed with a binder, such as resin. A fibrous preform is prepared by setting the impregnated fibers into shape and submitting them to a thermal treatment, after which a liquid infiltration is carried out using a mixture of silicon and boron in a molten state, the quantity of boron in this mixture preferably being in a ratio of 1 to 3% by weight with respect to the silicon. The resulting composite material comprises a matrix with a principal phase constituted by silicon carbide formed in situ, or by silicon carbide containing boron and formed in situ, and an additional phase constituted by a silicon and boron solution.

Among the glasses susceptible of being formed as a result of implementing an anti-oxidation process, those based on boron have limited low pressure performance and are sensitive to the effects of humidity. The same is not true of glasses based on silica, but silica glasses are not effective at medium temperature (because their viscosity is too high).

Glasses based on a mixture of boron and silica, i.e. "borosilicate" glasses do not suffer from those drawbacks, or at least they are greatly attenuated. Juxtaposing layers of a precursor for boron-based glasses and a precursor for silica-based glasses, e.g. an inner layer of boron carbide ($B_4C$) and an outer layer of silicon carbide (SiC) as in the state of the art mentioned above, would yield a boro silicate glass.

As shown in highly diagrammatic form in FIG. 4, when two layers of $B_4C$ and SiC are superposed and exposed to oxidizing conditions, corresponding oxides ($B_2O_3$ and $SiO_2$, respectively) are formed on the walls of a crack, at the level of the $B_4C$, and SiC layers. These oxides are formed adjacent to each other along the crack. There is no immediate formation of borosilicate type glass. Thus, at an initial oxidation stage, the above-mentioned defects of boron-based glasses and of silica-based glasses are to be found juxtaposed. In addition, the $B_4C$ and the SiC layers do not oxidize at the same rate and they do not have the same physico-chemical properties; in particular they do not have the same thermal expansion coefficients.

Thus, in a high temperature oxidizing atmosphere, it is observed that the oxide $B_2O_3$ advances at the interface between the $B_4C$ and the SiC layers as shown in FIG. 5. If the composite material is then placed in the presence of humidity, the oxide $B_2O_3$ hydrates into $B_2O_3$, n-$H_2O$ which is greater in volume than the oxide that gave rise to it. This tends to split the interface between $B_4C$ and SiC perpendicularly to the layers, thereby separating the layers (FIG. 6). At worst, the outer layer of SiC flakes off, in any case, there will at least be cracking at the interface between $B_4C$ and SiC, and a repetition of that phenomenon. These phenomena encountered with protections that associate layers of $B_4C$ and SiC are described, in particular, in an article by C.W. Ohlhorst, et al., entitled "Performance evaluations of oxidation-resistant carbon-carbon composites" (Fifth National Aerospace Plane Symposium, Oct. 18-21, 1988, Paper No. 69).

Thus, an object of the present invention is to provide a process for obtaining refractory composite material protected against corrosion over a wide temperature range, and up to at least 1700° C., by formation of at least one healing layer of borosilicate glass when the cracked material is placed under oxidizing conditions at high temperature.

SUMMARY OF THE INVENTION

According to the invention, this object is achieved by the fact that the process comprises a step of forming, within the matrix or at a surface thereof, at least one continuous phase constituted by a ternary silicon-boron-carbon (Si-B-C) system obtained by chemical vapor deposition or chemical infiltration using a gas comprising a mixture of precursors for the elements silicon, boron, and carbon, in such a manner as to obtain a boron concentration in the ternary Si-B-C system that is not less than 5% in atom percentage.

The term "continuous phase" is used herein to designate a phase that constitutes a continuous barrier between the outside surface of the material and the fibers of its fibrous reinforcement.

The chemical vapor deposition or infiltration process is particularly advantageous because it enables the deposited elements forming the Si-B-C system to be distributed uniformly, and in particular it enables the Si and B elements that are precursors for the borosilicate glass to be intimately mixed and uniformly distributed. Throughout the text, the term "Si-B-C phase" shall thus refer to a ternary Si-B-C material in which the elements Si, B and C are uniformly distributed.

Thus, an oxidation of this phase at high temperature directly yields a borosilicate glass, thereby avoiding the drawbacks that are encountered when there are superposed layers of precursors for boron-based glass and for silica-based glass.

The Si-B-C system may constitute the outside layer of the matrix, thus providing surface protection.

However, it is advantageous for the Si-B-C system to be formed within the matrix to constitute integrated protection that is not subject of being flawed by local damage, as could happen with surface protection only.

It is even possible for the matrix to be essentially constituted by the Si-B-C phase, which phase may optionally be separated from the reinforcing fibers by an underlayer and may be itself coated with additional surface protection.

When the composite material contains carbon, either as a constituent of the reinforcing fibers or of an interphase between the fibers and the matrix, it is advantageous to separate the carbon from the Si-B-C system by refractory material that does not contain boron, e.g. a refractory carbide such as silicon carbide, zirconium carbide, or hafnium carbide. Interposing such refractory material prevents the carbon from reacting with the glass formed by the Si-B-C system, and it prevents the boron diffusing into the carbon.

Finally, at the end of manufacture, the composite material may be provided with a surface coating of an oxide or of a refractory carbide, e.g. silicon carbide, thus constituting an additional barrier against oxygen.

Another advantage of the process according to the invention comes from the fact that it is possible to control the proportions of the elements in the ternary system Si-B-C accurately, in particular by selecting the relative proportions of the component parts of the gas used. As a result, the composition of the ternary system Si-B-C can be adjusted accurately to enable a borosilicate glass to be formed that is adapted to the design utilization temperature of the composite material, i.e. a glass whose viscosity properties at that temperature are appropriate for optimally providing a healing function relative to the cracks in the matrix of the material.

The state of the art does admittedly embrace composite materials in which the matrix contains the elements Si, B and C. For instance, the matrix disclosed in the aformentioned patents, U.S. Pat. No. 4,889,686 and U.S. Pat. No. 4,944,904, comprises an SiC phase, the SiC possibly containing B, and an Si+B phase. However, in contrast with the process according to the present invention, the method described in these patents, namely infiltration of elementary carbon followed by a liquid impregnation by molten silicon and boron, does not make it possible to obtain an intimate mixture of the Si, B and C elements within a same phase, with a regular distribution of these elements in that phase. Further, it does not allow an accurate control of relative quantities of the Si, B and C elements in the above-mentioned same phase, with a possible variation in the proportion of boron over a wide range, for example from 5 up to 60% boron by atomic percentage. Yet these two conditions, viz; an intimate mixture of uniform distribution of the Si, B and C elements within a same phase, and an accurate control of their relative quantities, are necessary to obtain the desired borosilicate glass under the best possible conditions.

Moreover, and contrary to the liquid impregnation technique, the chemical vapor deposition or infiltration according to the invention affords a precise control of the thickness of the Si-B-C phase, as well as its setting in the matrix.

Another specific advantage of the method of the invention lies in the possibility of making the ternary Si-B-C phase continuously with the other phases in the matrix, when these other phases are also formed by chemical vapor deposition or chemical infiltration. Under such circumstances, it is possible to switch from Si-B-C to some other phase (or vice versa) merely by changing the composition of the gas used, possibly while also modifying various parameters, such as temperature and pressure.

In particular, the switching over from SiC to Si-B-C, or vice versa, merely calls for a modification in the composition of the gas by increasing or decreasing the proportion of the precursor for the element boron. This modification can be done progressively so as to achieve a continuous transition between the SiC and Si-B-C phases.

BRIEF DESCRIPTION OF THE DRAWINGS

Implementations of the process according to the invention shall be described by way of example with reference to the accompanying drawings, in which.

DETAILED DESCRIPTION OF THE PREFERRED EMBODIMENTS

In the examples given below, the refractory composite materials to be protected are generally of the two-dimensional (2D) type or of the three-dimensional (3D) type, and are made of carbon/carbon (C/C), or of carbon/silicon carbide (C/SiC, a reinforcing fibrous texture densified by a matrix that is essentially constituted by silicon carbide). Naturally, the invention is equally applicable to other 2D or 3D refractory composite materials, e.g. 2D composite materials of silicon carbide and silicon carbide (SiC/SiC) with a boron nitride or pyrolytic carbon interphase between the reinforcing SiC fibers and the SiC matrix.

A 2D composite material is a material in which the fibers of the fibrous reinforcement form a two-dimensional system constituted by a cloth or by sheets of threads or of cables, optionally disposed in a few superposed layers.

A 3D composite material is a material in which the reinforcing fibers form a three-dimensional system. The reinforcing texture is obtained, for example, by three-dimensional weaving or by superposing and interconnecting two-dimensional plies of cloth, felt, or sheets of threads or of cables, . . . , with the plies being interconnected by needling, by implanting threads, . . .

The composite material is provided with at least one continuous protective phase in its core or on its surface by an infiltration process or by a chemical vapor deposition process. To this end, an installation such as that described in Document FR-2 594 119 may be used.

Figure 1:
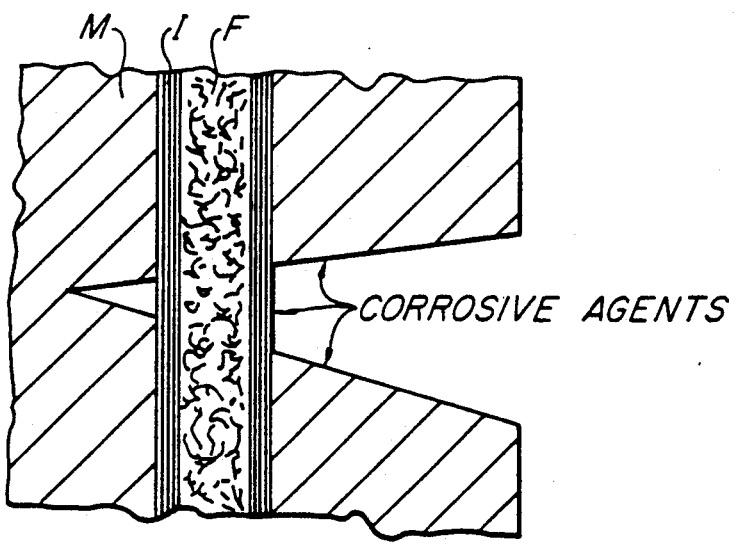
FIGS. 1, 2, 3, 4, 5 and 6, already described above, show cracking and oxidation phenomena in refractory composite materials.
Figure 2:
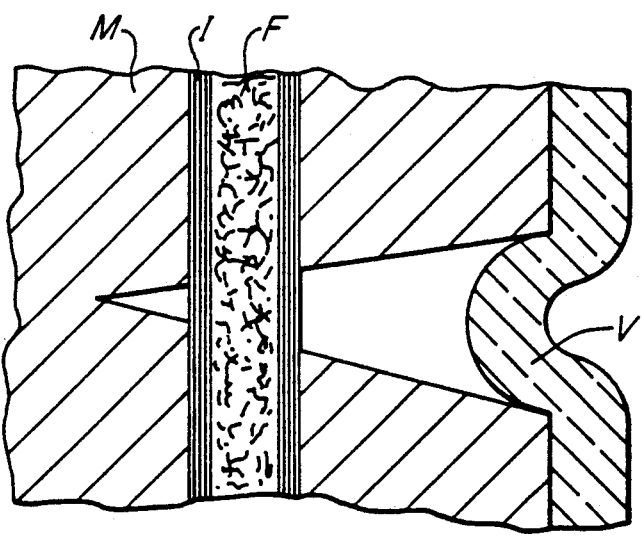
Figure 3:
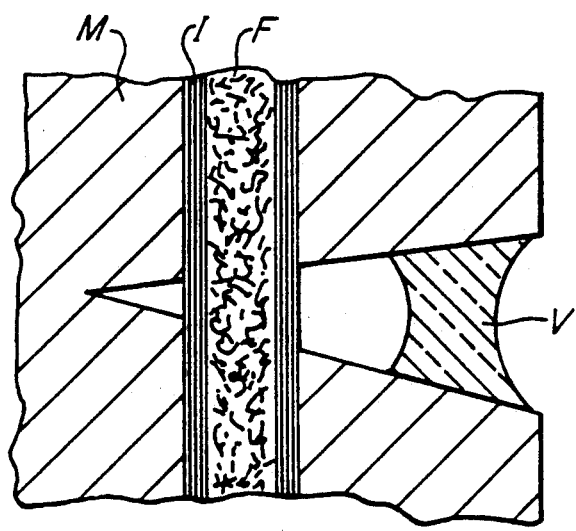
Figure 4:
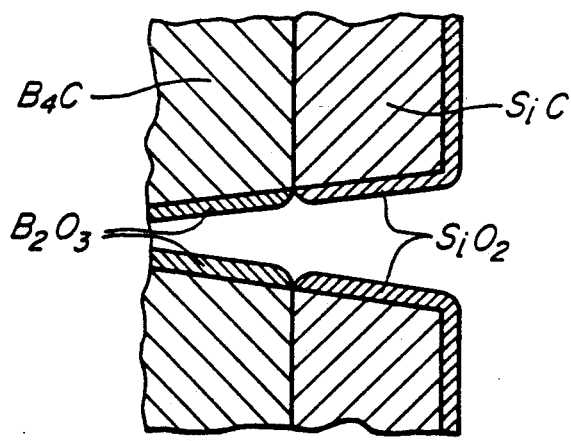
Figure 5:
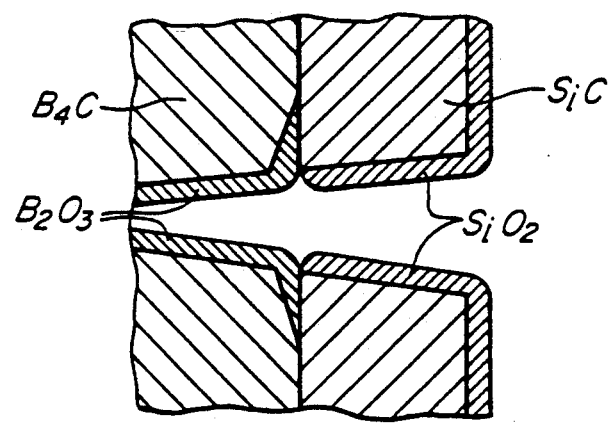
Figure 6:
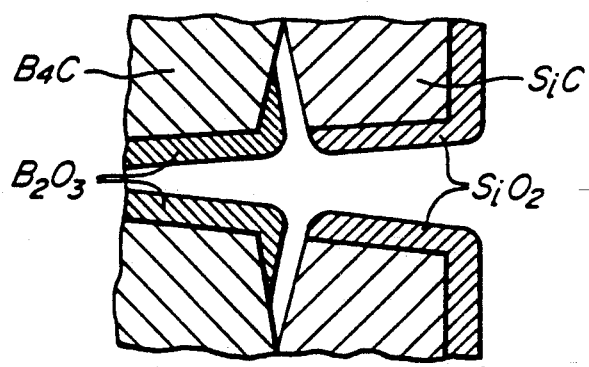
Figure 7:
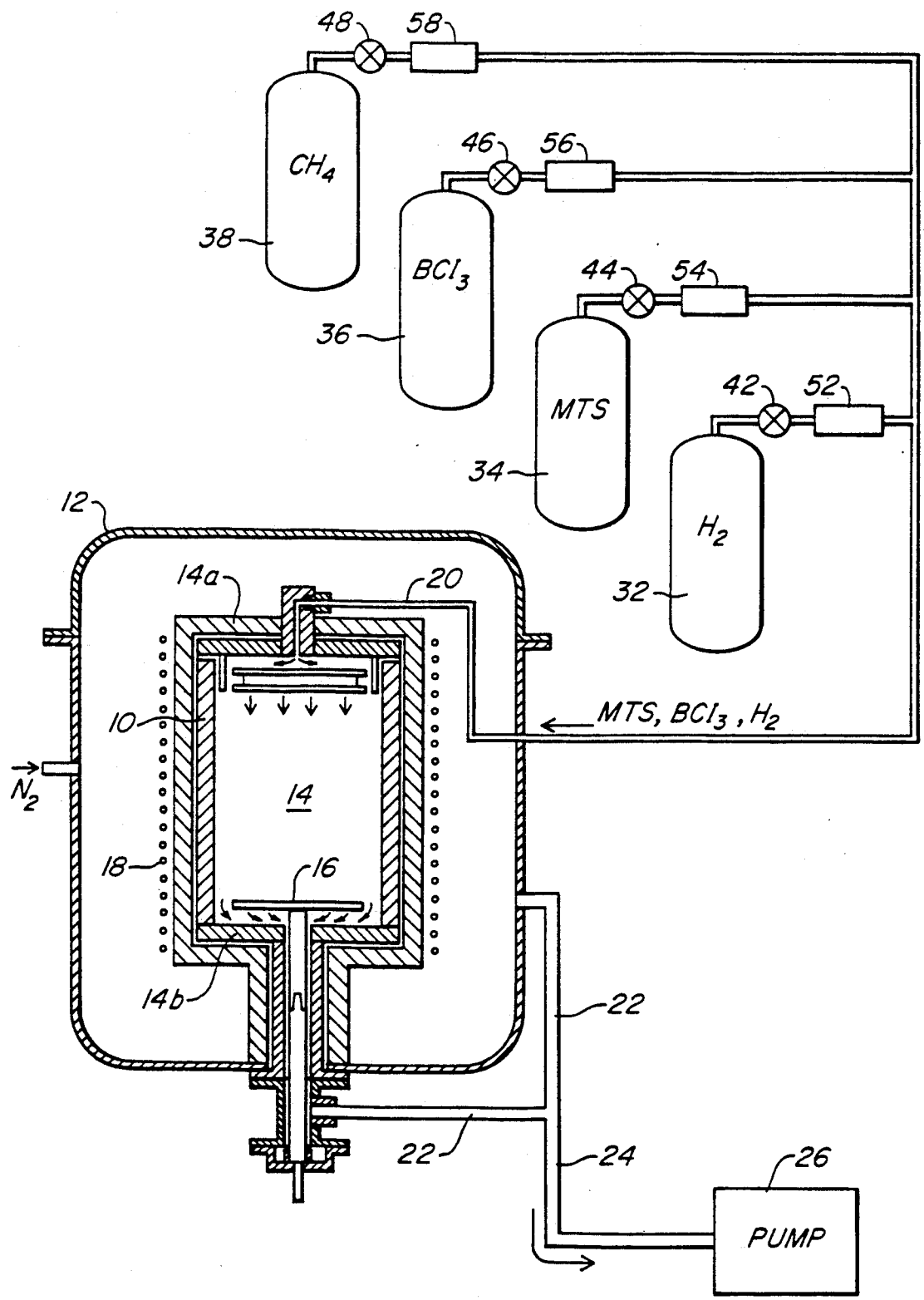
FIG. 7 is a highly diagrammatic representation of an installation for making a refractory composite material protected in accordance with the invention.

This installation (FIG. 7) comprises a graphite susceptor 10 situated inside an enclosure 12 and delimiting a reaction chamber 14 in which workpieces of composite material to be treated are disposed on a turntable 16. The susceptor is heated by an inductor 18 disposed thereabout.

The reaction chamber 14 is fed with gas that gives rise to the desired deposit via a pipe 20 which passes through the wall of the enclosure 12 and which terminates in the chamber 14 via a cover 14a that closes the top of the chamber.

Residual gas is removed from the reaction chamber by means of one or more ducts 22 which open out into the bottom of the chamber 14b and which are connected outside the enclosure to a pipe 24 leading to pumping apparatus 26.

The volume around the susceptor 10 and inside the enclosure 12 is swept with an inert gas, such a nitrogen $N_2$ forming a buffer around the reaction chamber.

Gas sources 32, 34, 36, and 38 provide the ingredients for the gas that is inserted into the reaction chamber. Each gas source is connected to the pipe 20 via a duct including a respective automatically-controlled stop cock 42, 44, 46, or 48, and a respective mass flow-rate meter 52, 54, 56, or 58, with the flow meters enabling the relative proportions of the ingredients in the gas to be regulated.

To deposit a ternary Si-B-C system, the gas is made up of a mixture of precursors for the elements Si, B, and C, together with a reduction element such as hydrogen $H_2$.

The carbon and silicon elements may be generated by precursors belonging respectively to the hydrocarbon family and to the silane or chlorosilane families. They may also be generated together by decomposing an organo-silane precursor such as methyltrichlorosilane (MTS).

The B element is generated by a borane or a halide, such as boron trichloride ($BCl_3$).

Consequently, the gas sources 32, 34, and 36 are respectively sources of $H_2$, of MTS, and of $BCl_3$.

Gas source 38 is a source of hydrocarbon, e.g. of methane, enabling the element carbon to be provided, thereby enabling the installation to be used to form the matrix of the composite material when the matrix is constituted at least in part by carbon, or to form a pyrolytic carbon interphase between the reinforcing fibers of the composite material and a ceramic matrix. Under such circumstances, when the ceramic matrix is constituted by silicon carbide, it may be formed after the interphase by replacing the gas constituted by the methane with a gas formed by a mixture of MTS and of hydrogen.

Figure 8:
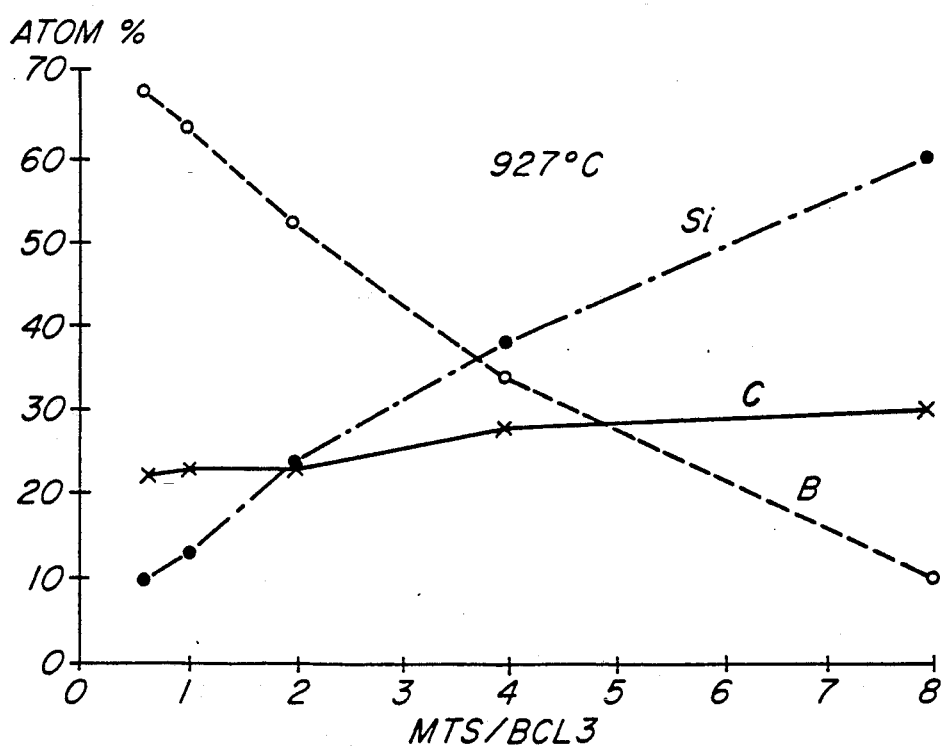
FIGS. 8 and 9 show how the composition of a ternary Si-B-C phase, obtained by chemical vapor deposition or infiltration, varies as a function of the composition of the gas used, respectively at 927° C. and at 1027° C.
Figure 9:
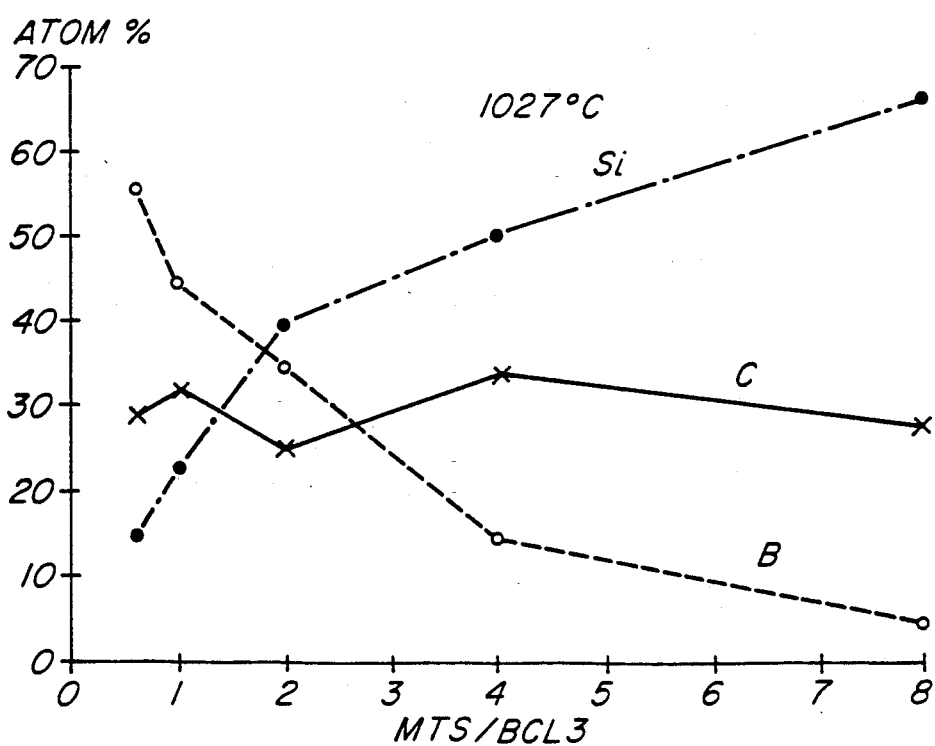

The composition of the ternary Si-B-C system is a function, in particular, of the relative proportions of the precursors MTS and $BCl_3$ in the gas. For a given ratio between the mass flow rate of $H_2$ and the mass flow rate of MTS, FIG. 8 shows how the composition of the ternary Si-B-C system varies (in atom percentages of each element) as a function of the ratio between the mass flow rate of MTS and the mass flow rate of $BCl_3$, with the temperature inside the reaction chamber being 927° C. FIG. 9 shows the same variation, but at a temperature of 1027° C. inside the reaction chamber.

It is thus possible to control the composition of the ternary Si-B-C system relatively accurately by selecting the relative proportions of MTS and $BCl_3$ in the gas. Depending on the utilization temperature of the composite material, it is thus possible to adapt the composition of the ternary Si-B-C system to obtain a borosilicate type glass having the desired behavior at that temperature.

In addition, it is extremely easy to switch from a matrix constituted by SiC to a matrix constituted by Si-B-C, or vice versa. This can be done merely by admitting or not admitting the $BCl_3$ precursor in the gas which is otherwise made up of MTS and $H_2$.

Figure 10:
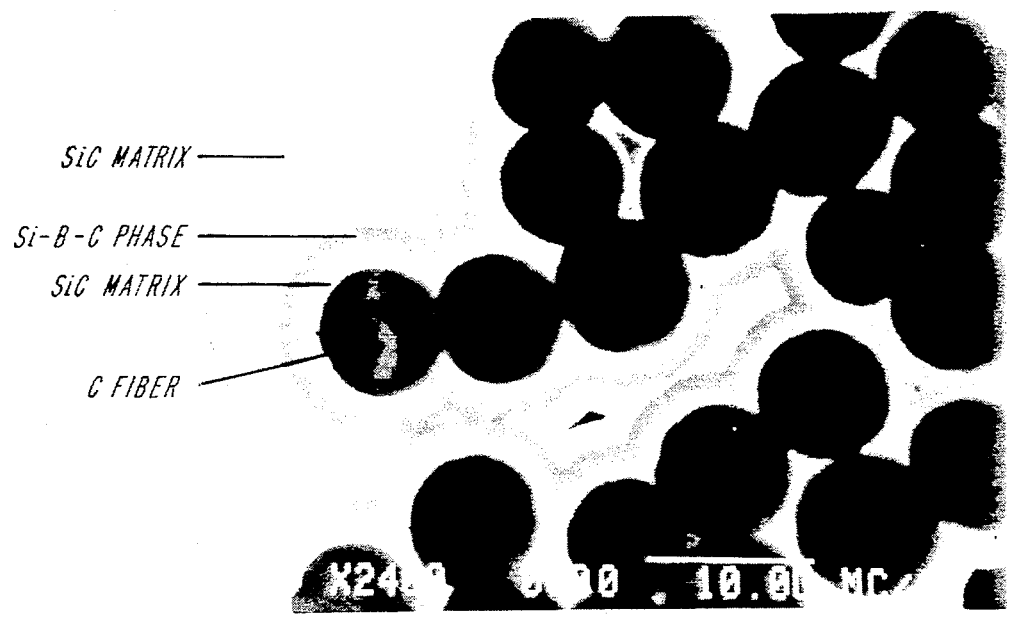
FIG. 10 is a photomicrograph showing a refractory composite material protected in accordance with the invention with integrated Si-B-C phase.

This change in the composition of the gas may be performed smoothly thus making it possible to achieve a continuous transition between SiC and Si-B-C, or it may be performed abruptly. FIG. 10 shows a C/SiC composite material in which a continuous Si-B-C phase is integrated. The matrix comprises a first internal phase of SiC between the carbon fibers and the Si-B-C phase, and an outer phase of SiC formed on the Si-B-C. The transition between the first SiC phase and the Si-B-C phase is smooth, giving rise to a composition gradient between these two phases. In contrast, the outer phase of SiC has a sudden interface with the Si-B-C phase.

Chemical vapor infiltration of Si-B-C into the composite material from a gas containing a mixture of MTS, $BCl_3$, and $H_2$, is performed at a temperature lying in the range 800° C. to 1150° C., and at a pressure lying in the range $0.1 \times 10^3$ and $50 \times 10^3$ N/m². Naturally, an external deposit of Si-B-C may be provided under similar conditions.

Figure 11:
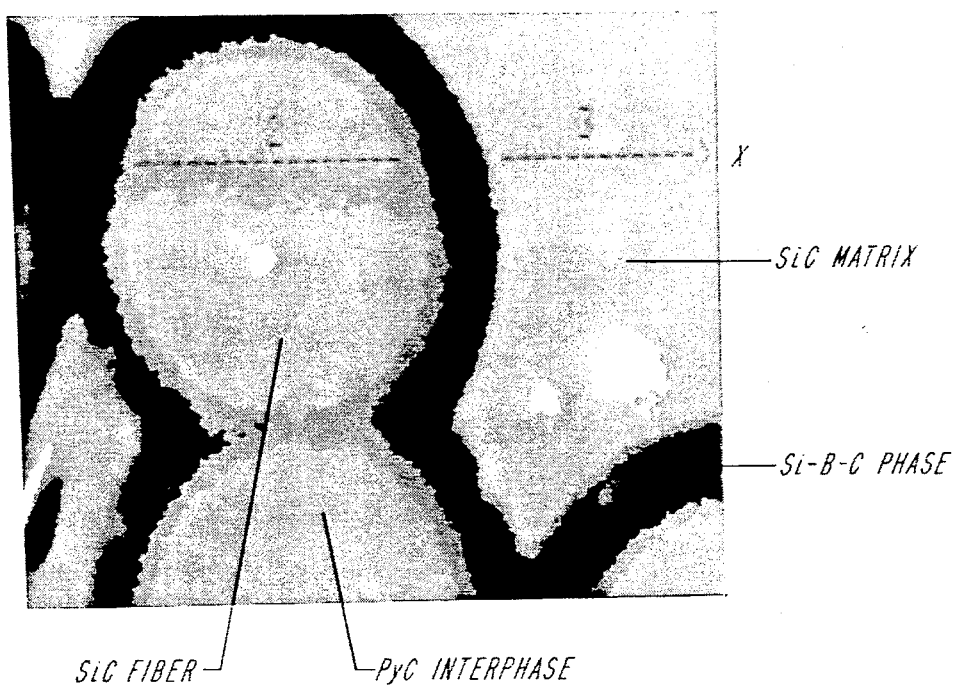
FIG. 11 is a photomicrograph showing an SiC/SiC type refractory composite material with an integrated Si-B-C phase.

FIG. 11 shows an SiC/SiC type composite material having a pyrolytic carbon (PyC) interphase between the SiC fibers of the fibrous reinforcement and the matrix. The matrix includes an integrated Si-B-C phase which is formed on the PyC interphase by chemical vapor infiltration, with the remainder of the matrix being constituted by SiC deposited by chemical vapor infiltration as a continuation of the Si-B-C phase, with the transition between the two being made smooth by progressively reducing the proportion of boron that is deposited.

Figure 12:
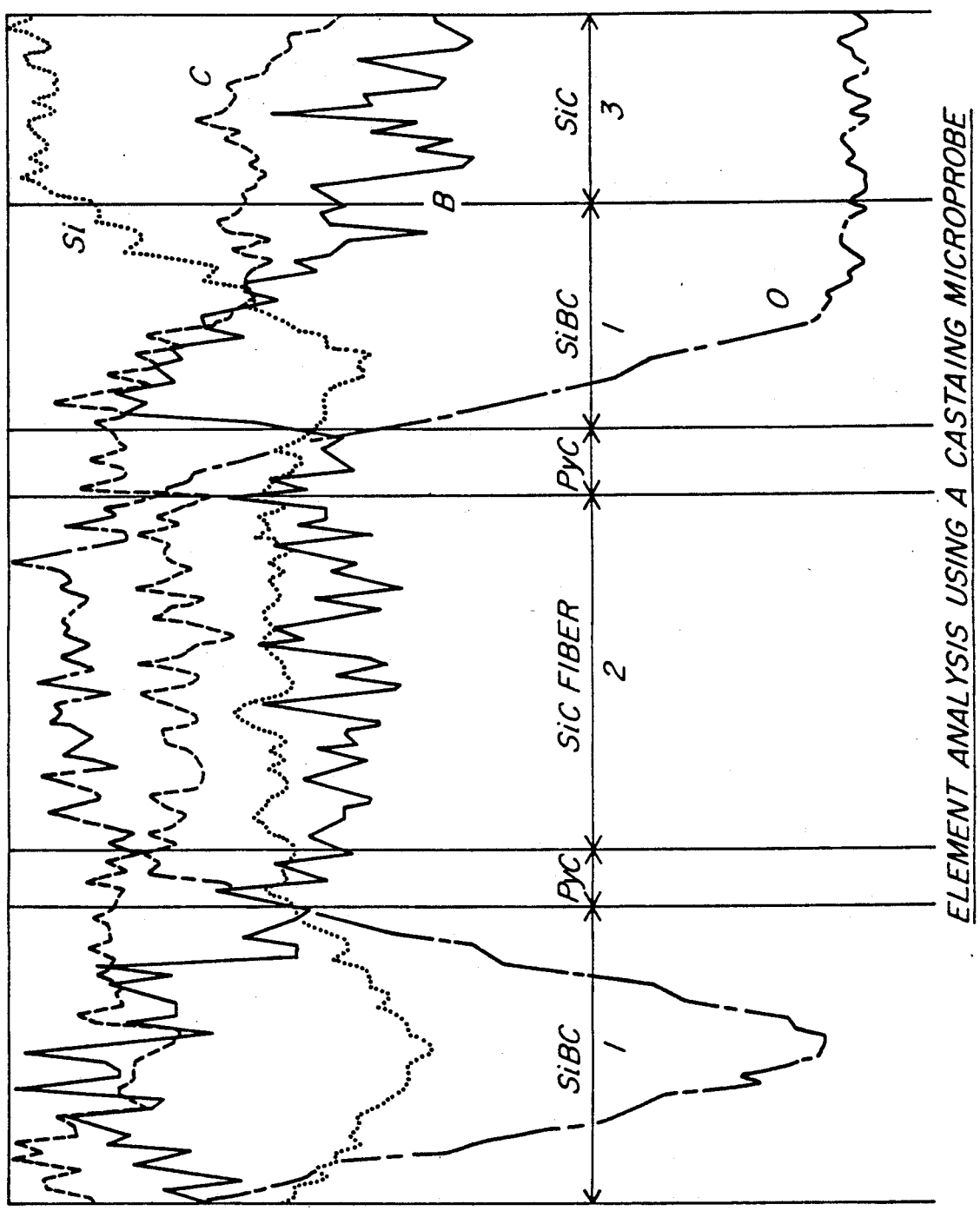
FIG. 12 is a graph showing an analysis of the elements in the FIG. 11 material as obtained by a Castaing microprobe, measuring changes in the concentrations of oxygen, carbon, silicon, and boron.

FIG. 12 shows the result of analyzing the material of FIG. 11 along the X-axis by using a Castaing microprobe. The quantities of oxygen (O), carbon (C), silicon (Si), and boron (B) are evaluated during this analysis.

The curve representing the quantity of oxygen forms a plateau at the level of the fiber, which can be explained by the fact that the fibers used contain significant quantities of oxygen, (fibers sold under the name "Nicalon" by the Japanese firm Nippon Carbon). In contrast, oxygen is absent in the remainder of the material.

The carbon content forms a plateau at the level of the fiber, and then increases naturally in the PyC interphase, as shown by the curve representing the carbon content. This curve does not form a plateau at the level of the PyC interphase because the probe does not have sufficient resolution, since the probe uses a spot whose diameter is greater than the thickness of the PyC layer (spot diameter about 1 micron and layer thickness about 0.5 microns). The carbon content then falls to a substantially constant value in the layers of Si-B-C and of SiC.

The curve showing the silicon content forms a plateau at the level of the fiber before decreasing in the PyC interphase and then increasing again in the Si-B-C. Thereafter, the curve forms a plateau in the remaining SiC phase of the matrix.

The curve showing the boron content form a plateau at the level of the fiber and in the PyC interphase, and increases sharply at the beginning of the Si-B-C layer. Thereafter the boron content falls off showing that there is a smooth transition between the Si-B-C layer and the outer SiC.

FIG. 12 thus shows that it is possible to go from the Si-B-C layer to the SiC layer without interrupting the chemical vapor infiltration process, simply by changing the composition of the gas. It is equally possible to go in the opposite direction from an SiC layer to a Si-B-C layer.

The material of FIG. 11 was made and analyzed essentially for the purpose of verifying that such a smooth transition between an Si-B-C layer and an SiC layer is possible. As mentioned above, it is preferable to avoid depositing the Si-B-C layer in direct contact with carbon, as happens in this material since the Si-B-C layer is in contact with the PyC interphase.

The chemical vapor infiltration process not only allows a precise control of the composition of the Si-B-C phase and an easy transition from an Si-B-C phase to an SiC phase, but also allows control of the thickness and setting of the Si-B-C phase in the matrix. In particular, it is possible to produce a composite material having a sequenced matrix, that is a matrix comprising several Si-B-C phases that are separated from each other by a different phase, such as an SiC phase.

Figure 13:
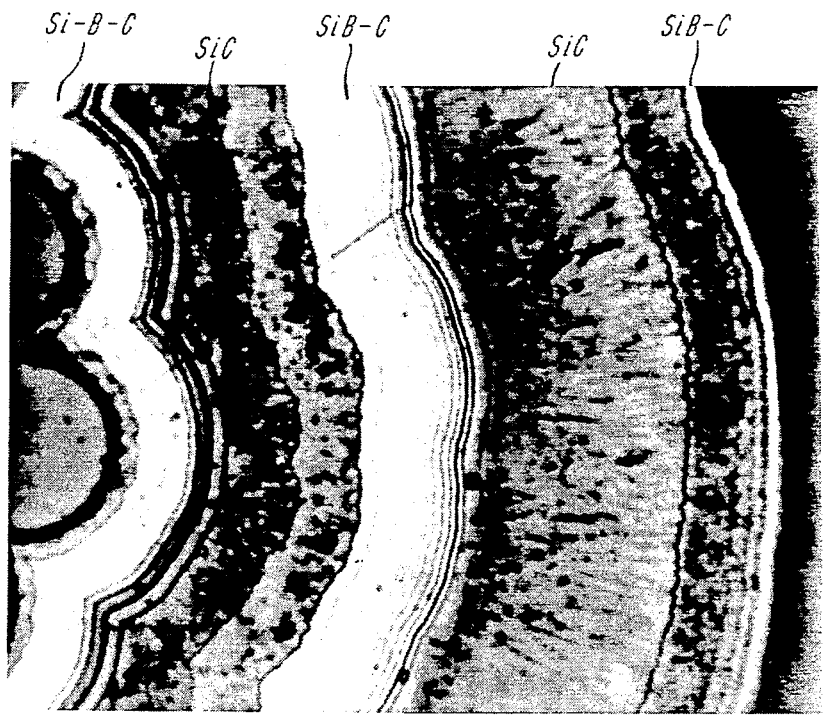
FIG. 13 is a photomicrograph showing a refractory composite material with an SiC fiber reinforcement and a sequenced matrix comprising three Si-B-C phases separated by SiC phases.

FIG. 13 shows such a sequenced matrix material, with three Si-B-C phases appearing in a lighter shade. In this material, the SiC fibers are coated with a PyC phase (appearing in darker shade) separated from the first Si-B-C phase by an SiC layer. The three Si-B-C phases are separated by SiC phases, and an external SiC phase is formed over the last Si-B-C phase.

Figure 14:
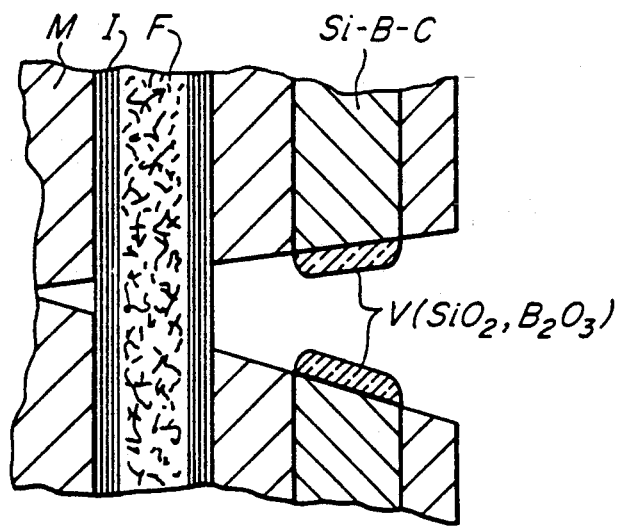
FIGS. 14, 15 and 16 show the effect of having an Si-B-C system for providing protection against corrosion in a refractory composite material that is protected in accordance with the invention.
Figure 15:
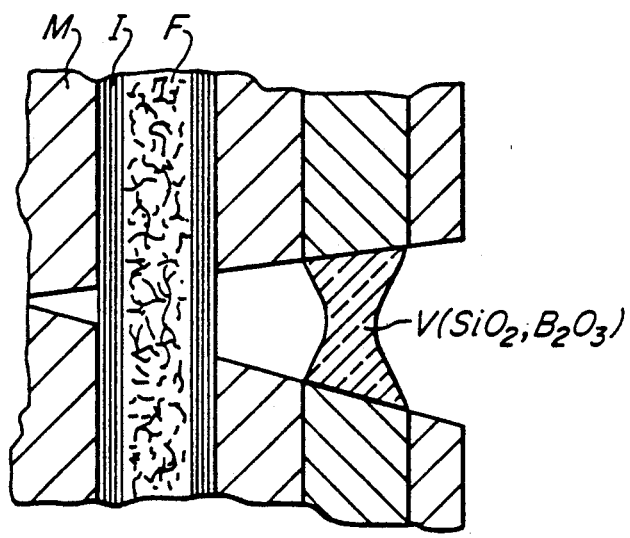
Figure 16:
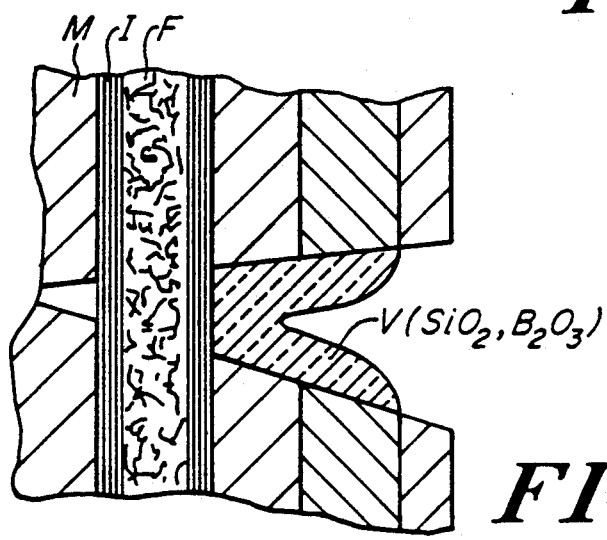

FIGS. 14 to 16 are highly diagrammatic and show the effect of having an Si-B-C layer integrated in a composite, with an interphase I being formed between the fibers F and the matrix M.

In the event of oxidation, an ($SiO_2$, $B_2O_3$) complex is formed on the wall of a crack over the Si-B-C layer (FIG. 14). There is thus formed a borosilicate glass V which closes the crack (FIG. 15) and which ends up covering the fiber (FIG. 16).

Figure 17:
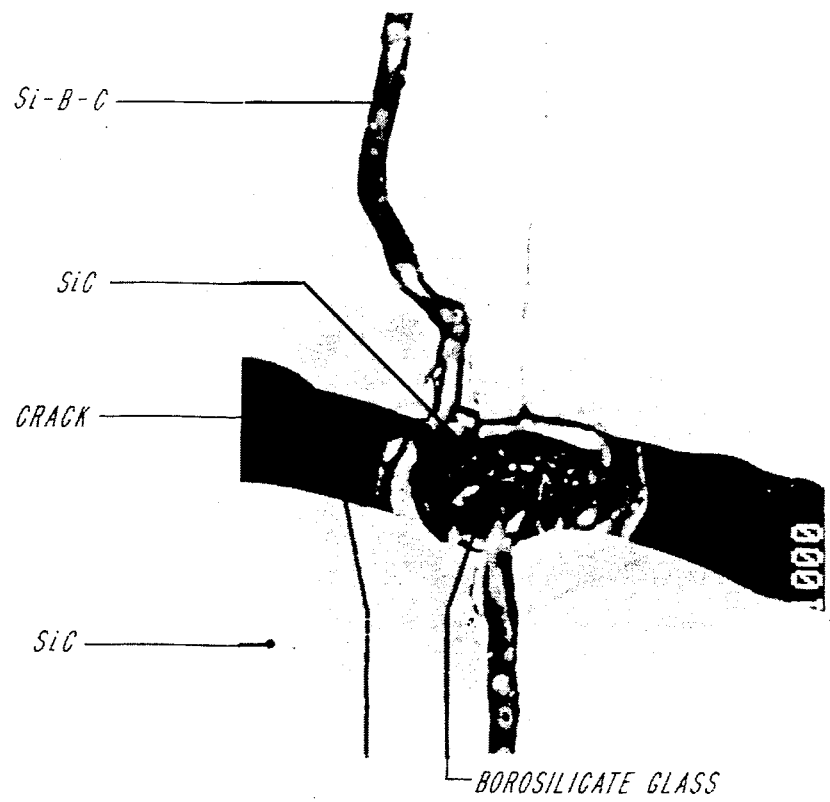
FIG. 17 is a photomicrograph showing a crack being sealed by a borosilicate type glass in a composite material protected in accordance with the invention.

FIG. 17 shows a matrix of a composite material having an Si-B-C phase between two SiC phases, with a crack passing through the SiC and Si-C-B phases, which layer is sealed by a borosilicate glass.

Figure 18:
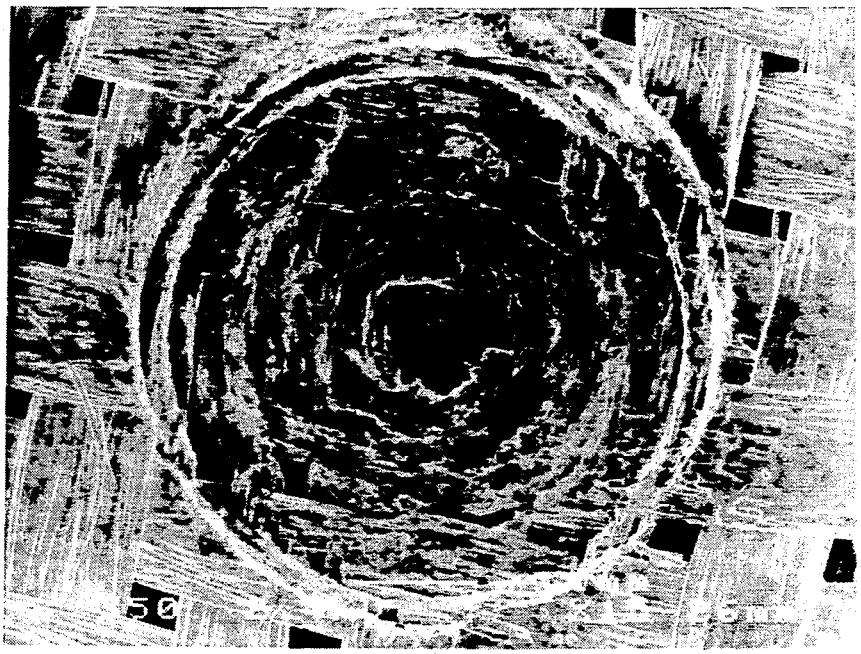
FIGS. 18 and 19 are photomicrographs respectively showing a fragment of material, such as the one shown in FIG. 13, in which a hole was formed, and, with greater magnification, a wall portion of the hole, after thermal treatment in air.
Figure 19:
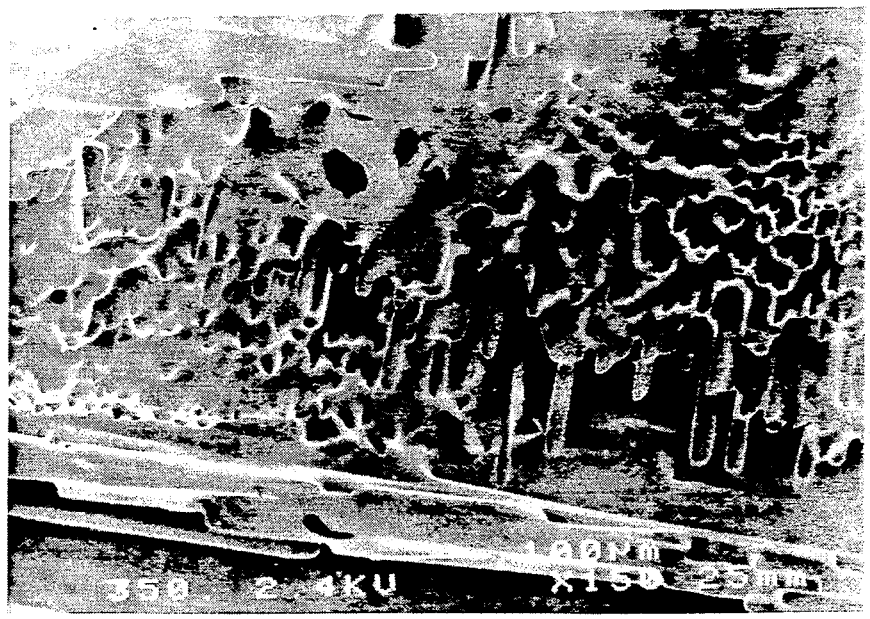

FIG. 18 shows a fragment of a composite material comprising a reinforcement made of SiC fibers and a sequenced SiC and Si-B-C matrix, with two separate Si-B-C phases, such as shown in FIG. 13. A hole was formed in the material, so exposing the SiC fibers and the PyC interphase. The wall of the hole was examined after exposure in air at 850° C. for a period of 16 hours. As can be seen quite clearly from FIG. 19, the tips of the fibers that were broken when the hole was formed have become coated with a continuous and uniform protective layer of glass.

The effectiveness of providing anticorrosion protection to a refractory composite material by means of Si-B-C is demonstrated in the examples below.

In most of the examples, the Si-B-C phase is implemented as an outer layer on the matrix, optionally with a subsequent surface coating of SiC. This is merely to demonstrate the effectiveness of the protection since, as already mentioned, the Si-B-C is even more advantageous when integrated within the matrix, notably to avoid it being damaged at the surface. Naturally, such integration within the matrix is meaningful only when the matrix does not contain carbon, at least not in its outer portions, as applies with composites having an SiC matrix or a C-SiC matrix (an inner matrix of carbon and an outer matrix of silicon carbide). In composites having a carbon matrix, e.g. C/C composites, the Si-B-C layer is naturally provided after the carbon layer, and optionally prior to a surface coating of SiC.

EXAMPLE 1

Rectangular samples of 2 D composite are used having the following dimensions: 20 mm × 10 mm × 2 mm. These samples are obtained by forming a 2 D fibrous texture of carbon (stacking a few plies of carbon cloth) and then by densification by chemical vapor infiltration of SiC.

The samples are provided with an anticorrosion coating by chemical vapor deposition of a ternary Si-B-C compound. This is obtained using a gas comprising a mixture of MTS, $BCl_3$, and $H_2$ at a temperature of about 1050° C. and at a pressure of about $4 \times 10^4 N/m^2$. Deposition is continued until the desired thickness is reached.

Three sets A, B, and C of protected workpieces are made using different gas compositions to provide ternary Si-B-C system deposits having the following thicknesses and compositions (expressed as atom percentages):

workpieces A: 35 microns thick, Si(44%)-B(1%)-C(55%);

workpieces B: 35 microns thick, Si(48%)-B(3%)-C(49%); and workpieces A: 40 microns thick, Si(45%)-B(6%)-C(49%).

The effectiveness of the protection against corrosion is verified by exposing workpieces A, B, and C to air at a temperature of 1300° C. for different lengths of time and by measuring the relative change in mass dm/m of the workpieces, with a loss of mass meaning that carbon has been lost by oxidation.

Figure 20:
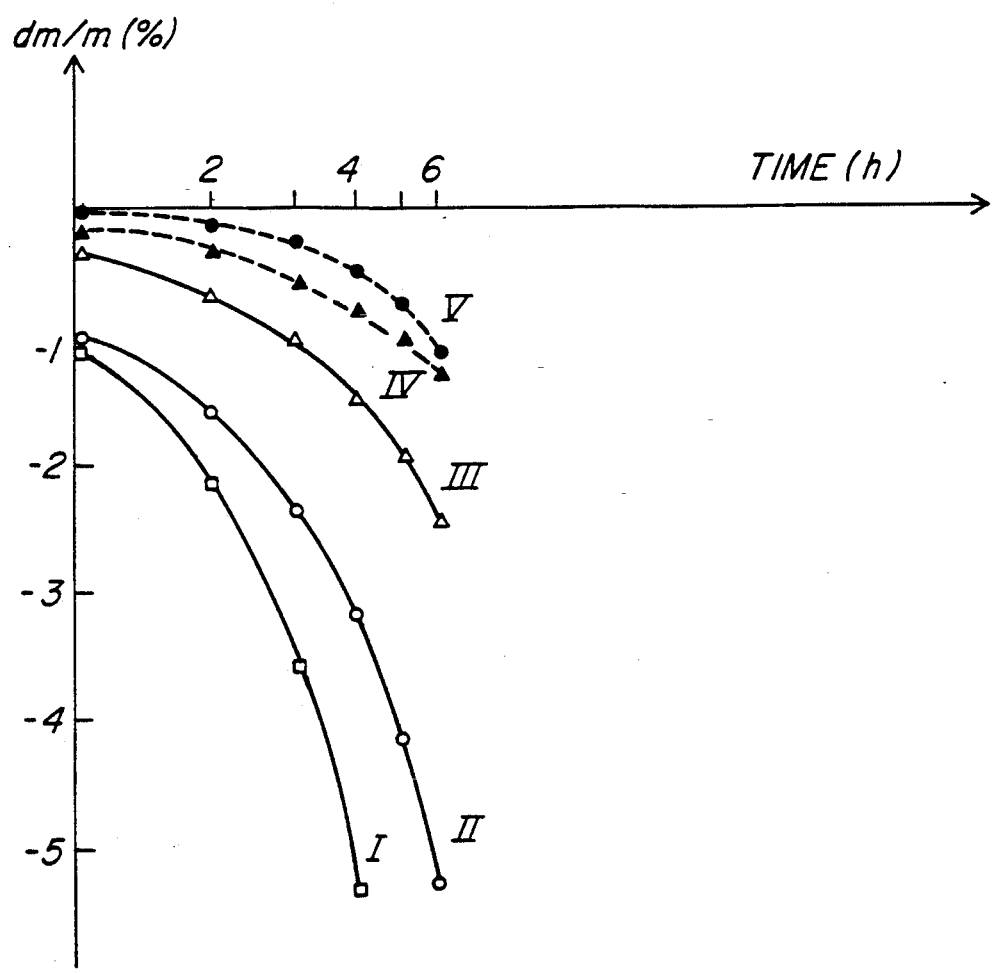
FIG. 20 is a graph with curves showing changes in mass loss as a function of the duration of oxidation treatment at 1300° C. for parts made of 2D C/SiC composite material coated with a layer of Si-B-C.
Figure 10:
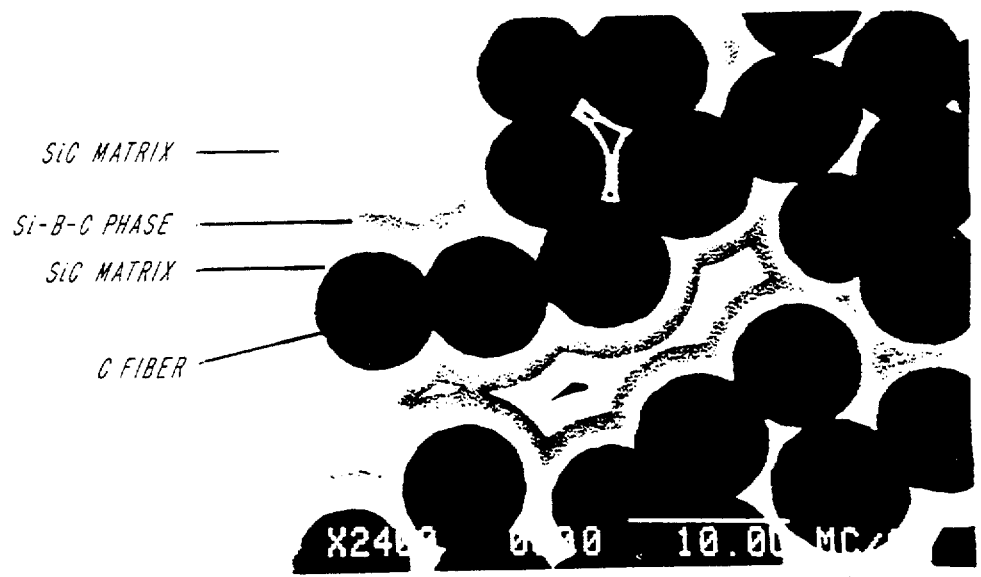
Figure 11:
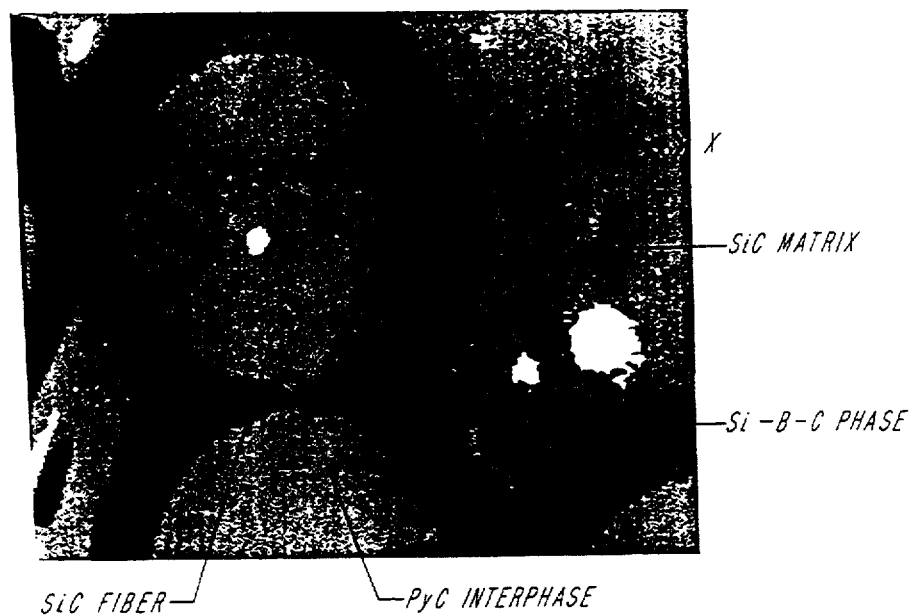

Curves I, II, and III in FIG. 20 show the evolution of mass loss as a function of time for workpieces A, B, and C respectively. The curves show that it is necessary to form a ternary system which is sufficiently rich in boron to increase the sealing capacity of the borosilicate that is formed by reducing its viscosity at a given temperature. It would appear that the boron content should be not less than 5% in atomic percentage.

EXAMPLE 2

The same samples of composite to be protected are used as in Example 1.

The samples are provided with an anticorrosion coating by chemical vapor deposition, constituting in succession an inner layer of SiC and a layer of a ternary Si-B-C system.

The inner SiC layer is obtained using a gas comprising a mixture of MTS and $H_2$, with the temperature in the reaction chamber being about 1050° C. and the pressure being about $4 \times 10^4 \text{ N/m}^2$. Deposition is continued until the desired thickness is achieved.

The layer of ternary Si-B-C composition is obtained as specified in Example 1. The ternary Si-B-C compound is deposited continuously with deposition of the inner layer of SiC merely by changing the composition of the gas by adding $BCl_3$ thereto, with the ratio between the MTS flow rate and the $BCl_3$ flow rate being chosen as a function of the desired composition for the ternary system. Deposition is continued in this way until the desired thickness is obtained.

An oxidation test in air at 1300° C. is carried out on test pieces D provided with anti-oxidation protection in the above-described manner using a 30 micron thick inner layer of SiC and an 8 micron thick ternary Si-B-C system layer having the following composition in atom percentage: Si(45%)-B(6%)-C(49%).

Change in mass dm/m is shown by curve IV in FIG. 20.

EXAMPLE 3

The procedure is the same as in Example 2 but the order in which the anti-oxidation protective coating layers are formed is reversed, thereby yielding workpieces E having an 8 micron thick ternary Si-B-C layer with an atomic percentage composition as follows Si(45%)-B(6%)-C(49%), and a 30 micron thick outer layer of SiC.

Curce V in FIG. 20 shows mass chamge dm/m of workpieces E as a function of time during an oxidation test at 1300° C.

Curves IV and V in FIG. 20 show the advantage of associating at least one SiC layer with the Si-B-C layer. An inner SiC layer isolates the Si-B-C layer from the underlying carbon, thereby preventing the carbon from reacting with the boron which give rise to boron-carbon compounds being formed that would make the material more fragile. It also prevents a high temperature reaction taking place between carbon and the boron oxide formed during oxidation. An outer layer of SiC constitutes an additional barrier against oxidation and makes it possible to contain the volatility of borosilicate glass which increases with increasing boron content. Clearly these advantages would be cumulated by the presence of an inner layer of SiC, and an intermediate Si-B-C layer and an outer layer of SiC.

EXAMPLE 4

Cylindrical samples of 3D composite having a diameter of 25 mm and a thickness of 5 mm are used, which samples are obtained by densifying by chemical vapor infiltration of carbon a reinforcing texture constituted by plies of carbon cloth in the form of disks that are stacked and needled together.

The samples are subjected to anticorrosion protection by chemical vapor deposition successively of an inner layer of SiC, an intermediate layer of Si-B-C, and an outer layer of SiC. The SiC layers are obtained as described in Example 2, and the Si-B-C layer is obtained as described in Example 1. The inner SiC layer, the Si-B-C layer, and the outer SiC layer have the following thicknesses respectively: 120 microns, 50 microns, and 60 microns; and the composition of the Si-B-C layer in atom percentage is Si(30%)-B(40%)-C(30%).

After oxidation treatment in air at 1300° C. for 60 h and then at 1500° C. for 60 h, the measured relative mass loss is only 0.4%.

EXAMPLE 5

Rectangular samples of 3D C/C composite are used having the following dimensions: 20 mm × 10 mm × 3 mm. In conventional manner the samples are formed by stacking and needling rectangular plies of carbon fiber cloth to form a fibrous reinforcement, which reinforcement is then densified with carbon by chemical vapor infiltration.

The samples are provided with anticorrosion protection by chemical vapor deposition of an inner layer of SiC, an intermediate layer of Si-B-C, and an outer layer of SiC, as in Example 4.

Table I below shows the results obtained (measured relative mass losses) for different thickness (in microns) of the protective layers and for different oxidation treatments in air. By way of comparison, a test is also performed on a sample provided merely with a layer of SiC. A test is also performed on a sample provided merely with a layer of Si-B-C.

TABLE I

| | | | | | | | |
|---|---|---|---|---|---|---|---|
| Inner SiC thickness (μm) | | 0 | 120 | 120 | 120 | 60 | 0 |
| Si—B—C thickness (μm) | | 140 | 60 | 60 | 60 | 60 | 0 |
| Si—B—C composition (atom %) | Si | 40 | 30 | 30 | 30 | 30 | |
| | B | 15 | 40 | 40 | 40 | 40 | |
| | C | 45 | 30 | 30 | 30 | 30 | |
| Outer SiC thickness (μm) | | 0 | 60 | 60 | 60 | 180 | 120 |
| Oxidation conditions in air | | 1300° C.-60 h +1500° C.-60 h | 850° C. 6 h | 850° C.-6 h +1000° C.-6 h | 1500° C. 30 h | 1500° C. 30 h | 1500° C. 30 h |
| Relative mass loss (%) | | −0.9 | −0.4 | −0.6 | −0.03 | −0.1 | −9 |

It can be seen that the protection provided by having a layer of Si-B-C is considerably greater than that conferred by a single layer of SiC, and that this applies over a wide temperature range.

EXAMPLE 6

Composite material samples are used as in Example 1.

Tables II and III below show the results obtained for different anticorrosion protection including an Si-B-C layer optionally associated with inner and outer SiC layers and for various different oxidation treatments in air.

Table III shows tests performed by way of comparison on samples without protection. The conditions under which SiC and Si-B-C are deposited are the same as those described above.

TABLE II

| Inner SiC thickness (μm) | | 0 | 0 | 0 | 0 | 0 | 0 | 120 |
|---|---|---|---|---|---|---|---|---|
| Si—B—C thickness (μm) | | 70 | 70 | 70 | 70 | 70 | 70 | 70 |
| Si—B—C composition (atom %) | Si | 40 | 20 | 20 | 40 | 40 | 30 | 40 |
| | B | 20 | 40 | 40 | 20 | 20 | 40 | 20 |
| | C | 40 | 40 | 40 | 40 | 40 | 30 | 40 |
| Outer SiC thickness (μm) | | 0 | 0 | 30 | 30 | 0 | 30 | 30 |
| Oxidation conditions in air | | 7 × 17' +2 × 1 h at 1500° C. | same | same | same | 1500° C. 3 h | 1500° C.-3 h +7 × 10' at 1700° C. | 1500° C. 30 h |
| Relative mass loss (%) | | −2 | −1.5 | −1 | −0.5 | −0.5 | −2 | −0.6 |

TABLE III

| Inner SiC thickness (μm) | | 40 | 40 | 30 | 70 | 70 | 100 |
|---|---|---|---|---|---|---|---|
| Si—B—C thickness (μm) | | 50 | 50 | 70 | 0 | 0 | 0 |
| Si—B—C composition (atom %) | Si | 20 | 20 | 30 | | | |
| | B | 40 | 40 | 40 | | | |
| | C | 40 | 40 | 30 | | | |
| Outer SiC thickness (μm) | | 10 | 10 | 60 | 0 | 0 | 0 |
| Oxidation conditions in air | | 800° C. 40 h | 1500° C. 24 h | 1700° C. 1 h 10' | 800° C. 24 h | 1500° C. 24 h | 1700° C. 1 h 10' |
| Relative mass loss (%) | | 0 | −0.1 to −0.3 | −1.7 | −7 to −20 | −20 to −35 | −3 |

Tables II and III show that the protection provided by having a layer of Si-B-C is excellent, and that this protection is effective over a wide temperature range (see Table III in particular), up to 1700° C.

EXAMPLE 7

Samples of composite material having 2D carbon reinforcement are made using an Si-B-C protective layer integrated within the SiC matrix, as shown in FIG. 10. To this end, a first layer of SiC having a thickness of 1 micron is deposited on the fibers, this is followed by infiltration of a layer of Si-B-C having a thickness of 1.5 microns, prior to densification being continued by SiC infiltration, such that the Si-B-C layer constitutes about 30% of the matrix.

In atom percentages, the composition of the Si-C-B layer is as follows: Si(20%)-B(40%)-C(40%).

After oxidation treatment in air at 1300° C. for 40 hours, the relative mass change dm/m is measured as being equal to +0.2% (i.e. a small gain in mass due to oxidation of SiC).

By way of comparison, samples of 2D C/SiC composite material are made under the same conditions except for integrating the Si-B-C layer, and are then subjected to oxidation treatment in air likewise at 1300° C., but for 24 hours only. The relative changes in mass dm/m as measured on the various samples lie in the range −7% to −15%.

Integrating an Si-B-C layer thus considerably improves resistance to oxidation.

EXAMPLE 8

Samples of composite material having a 2D SiC reinforcement are produced with a sequenced matrix of the same type as the one shown in FIG. 13, that is formed successively of a first Si-B-C phase, an intermediate SiC phase, a second Si-B-C phase and a third SiC phase on SiC fibers coated with a PyC layer and an SiC layer. The matrix is made of SiC and Si-B-C in approximately half-and-half proportions, the composition of the Si-B-C by atomic percentage weight being Si(10%)-B(60%)-C(30%).

The samples are tested at room temperature (RT) or in the air at high temperature using the four-point bending fixture, with an outer span of 50.8 mm and inner span of 25.4 mm. Table IV shows the results of tests carried out either at room temperature (RT) or under creep (using the four-point bending technique) at different stresses ranging from 150 MPa to 200 MPa for a maximum period of 100 hours and at 850° C. under air. The value in MPa expresses the equivalent flexing strain value applied to the sample. The first column of the table shows the value of the stress to rupture in flexure measured for an as-received sample (without having been submitted to a creep test). For comparison, are also shown the results of tests carried out on samples made of another composite material having a 2D SiC reinforcement and an SiC matrix, without Si-B-C phase.

TABLE IV

| Material | Stress to rupture at Room Temperature; four-point bending test | Test in air at 850° C. (creep test) |
|---|---|---|
| SiC reinforcement SiC + SiBC sequenced matrix | 420 MPa | No rupture after 100 hours under creep at 150 MPa |
| SiC reinforcement SiC + SiBC sequenced matrix | 420 MPa | No rupture after 100 hours under creep at 180 MPa |
| SiC reinforcement SiC + SiBC sequenced matrix | 420 MPa | No rupture after 100 hours under creep at 200 MPa |
| SiC reinforcement SiC matrix | 300 MPa | Rupture after 14 hours under creep at 150 MPa |

The sustained flexing strain exerted on the composite material gives rise to a considerable microcracking of the matrix. Accordingly, the table IV shows the protective effect due to the Si-B-C phase despite the cracking since, for a strain value equal to about one half of the initial breaking strain in flexion, no rupture is observed for after 100 hours with a material obtained by a process according to the invention, whereas a rupture occurs after 14 hours with the material that does not contain the Si-B-C phase.

We claim:

1. A method of making a refractory composite material that is protected against corrosion and that comprises fibrous reinforcement densified by a matrix, wherein said process comprises a step of forming, within said matrix or at a surface thereof, at least one continuous phase constituted by a ternary silicon-boron-carbon (Si-B-C) system in which the distribution of the silicon, boron and carbon elements is substantially uniform and which is obtained by one of a chemical vapor deposition process or a chemical infiltration process using a gas comprising a mixture of precursors for the elements silicon, boron, and carbon, in such a manner as to obtain a boron concentration in the ternary Si-B-C system that is not less than 5% in atomic percentage.

2. A method according to claim 1, further comprising the step of oxidizing the Si-B-C phase; and
   wherein in said forming step the composition of the gas provides the ternary Si-B-C system having a composition such that during said oxidizing step the Si-B-C phase forms a glass having viscosity properties sufficient for healing cracks in the matrix.

3. A method according to claim 1, wherein at least one Si-B-C phase is formed within the matrix.

4. A method according to claim 1, wherein one of the Si-B-C phases comprises an outer layer of the matrix.

5. A method according to claim 1, wherein the matrix consists essentially of said Si-B-C phase.

6. A method according to claim 1 wherein the fibrous reinforcement comprises elemental carbon or an elemental carbon interphase is present between the fibrous reinforcement and the matrix, and the method further comprises a step of forming between said elemental carbon and said Si-B-C phase a refractory phase that does not contain boron.

7. A method according to claim 6, wherein the refractory phase that does not contain boron is a refractory carbide.

8. A method according to claim 6, wherein the refractory phase that does not contain boron is silicon carbide.

9. A method according to claim 1, further comprising a surface coating of a refractory oxide or carbide at the surface of the refractory composite material.

10. In a method for making a composite material, the improvement comprising the steps of:
    (a) forming, from a gas comprising precursors of the elements silicon and carbon, a silicon-carbon (SiC) phase by one of:
        (1) a chemical vapor deposition process; and
        (2) a chemical infiltration process; and
    (b) forming, from a gas comprising a mixture of precursors of the elements silicon and boron and carbon, a silicon-boron-carbon (Si-B-C) continuous phase by one of:
        (1) a chemical vapor deposition process; and
        (2) a chemical infiltration process;
    wherein said Si-B-C continuous phase distribution of the elements silicon, boron and carbon is substantially uniform; and
    wherein a transition from the SiC phase to the Si-B-C phase is provided by smoothly adding increased amounts of the precursor for the element boron to the gas in step (a), and/or a transition from the Si-B-C phase to the Si-C phase is provided by smoothly reducing the content of the precursor for the element boron in the gas in step (b).

* * * * *

UNITED STATES PATENT AND TRADEMARK OFFICE
CERTIFICATE OF CORRECTION

PATENT NO. : 5,246,736

DATED : September 21, 1993

INVENTOR(S) : Stephane R. Goujard, et al

It is certified that error appears in the above-indentified patent and that said Letters Patent is hereby corrected as shown below:

In the Drawings, sheet 5 of 10, should be deleted and replaced with the attached sheet, consisting of FIG. 10 and corrected FIG. 11.

Column 5, line 44, "viz;" should read --viz:--

Column 11, line 29, "curce" should read --Curve--; and, "chamge" should read --change--.

Signed and Sealed this

Twenty-third Day of August, 1994

Attest:

BRUCE LEHMAN

*Attesting Officer*　　*Commissioner of Patents and Trademarks*